United States Patent
Sumiya et al.

(10) Patent No.: US 6,916,754 B2
(45) Date of Patent: Jul. 12, 2005

(54) DIELECTRIC CERAMIC MATERIAL AND METHOD FOR PRODUCING THE SAME

(75) Inventors: Atsuhiro Sumiya, Nishio (JP); Hitoshi Shindo, Nishio (JP); Eturo Yasuda, Nishio (JP); Takumi Kataoka, Nishio (JP); Toshiatsu Nagaya, Yokkaichi (JP); Akira Fujii, Yokkaichi (JP); Takashi Yamamoto, Chiryu (JP)

(73) Assignees: Nippon Soken, Inc., Aichi (JP); Denso Corporation, Aichi-pref. (JP)

( * ) Notice: Subject to any disclaimer, the term of this patent is extended or adjusted under 35 U.S.C. 154(b) by 271 days.

(21) Appl. No.: 10/028,991

(22) Filed: Dec. 28, 2001

(65) Prior Publication Data

US 2002/0160904 A1 Oct. 31, 2002

(30) Foreign Application Priority Data

Dec. 28, 2000 (JP) ........................................ 2000-399948
Nov. 29, 2001 (JP) ........................................ 2001-364641

(51) Int. Cl.$^7$ .......................................... C04B 35/497
(52) U.S. Cl. .............................. 501/134; 252/62.9 PZ; 264/618
(58) Field of Search ................................. 501/134, 135, 501/136, 137, 138, 139; 264/618; 252/62.9 PZ

(56) References Cited

U.S. PATENT DOCUMENTS 4,772,985 A * 9/1988 Yasumoto et al. ........ 361/321.3
5,798,052 A * 8/1998 Ando et al. ........... 252/62.9 PZ
5,954,996 A * 9/1999 Discko, Jr. ................. 252/79.1
6,444,141 B2 * 9/2002 Nakamichi et al. ..... 252/62.9 R

FOREIGN PATENT DOCUMENTS

JP          4-48505      * 2/1992

* cited by examiner

Primary Examiner—Karl Group
(74) Attorney, Agent, or Firm—Nixon & Vanderhye P.C.

(57) ABSTRACT

A PZT dielectric ceramic material is sintered at a desired low temperature to prevent deterioration of the performance of the base material.

An auxiliary oxide is used that is made by adding the oxide of at least one of tungsten and molybdenum to lead oxide in the following proportions:

$$PbOx+(WO_3y+MoO_3z)$$

where $x+y+z=1$, $0.005<y+z<0.4$ and $y, z \geq 0$. 0.5 mol % to 20 mol % of this auxiliary oxide is added to a mixture of a stock material of dielectric ceramic material or its calcination having a composition of $ABO_3$ type dielectric ceramic material where 0.9 molar ratio or more lead is included in site A assuming the proportion of site B is 1, and the material is mixed, formed and sintered. The content of tungsten and molybdenum combined is less than 0.098 mole in proportion to 1 mole of lead and the density of the dielectric ceramic material after sintering is 7.5 g/cm$^3$ larger. The auxiliary oxide is dispersed in the calcined powder to form a liquid phase at a desired temperature, to accelerate the sintering, thus making it possible to sinter at a lower temperature.

7 Claims, 12 Drawing Sheets

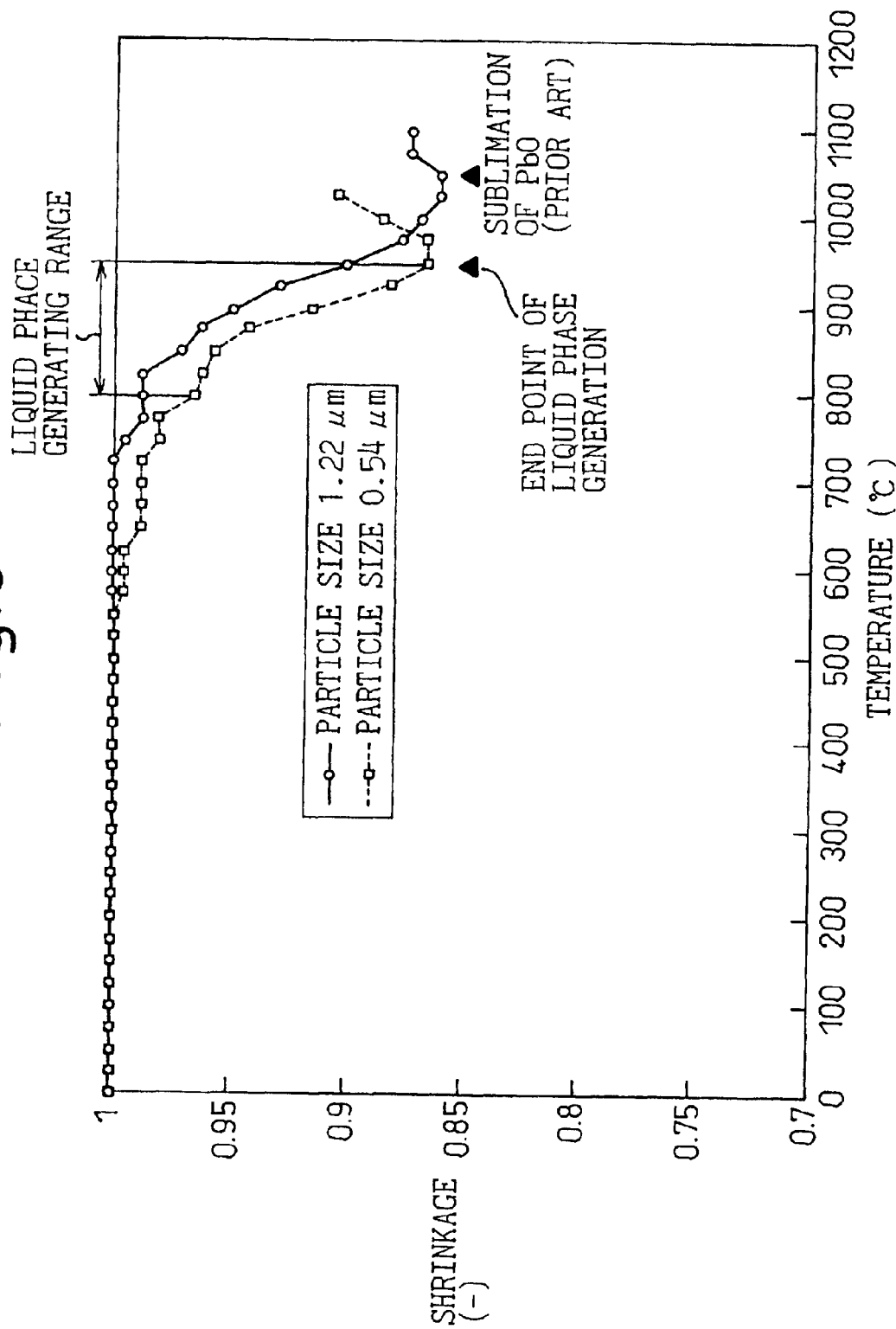

BOTTOM OF SAGGER

BOTTOM OF SAGGER

84 PbZrO₃ (32g IN TOTAL)

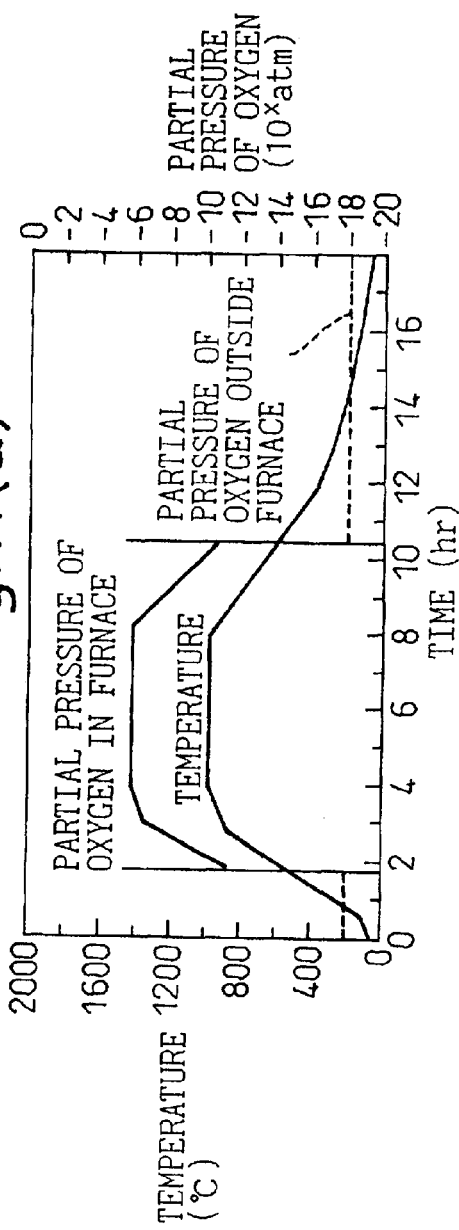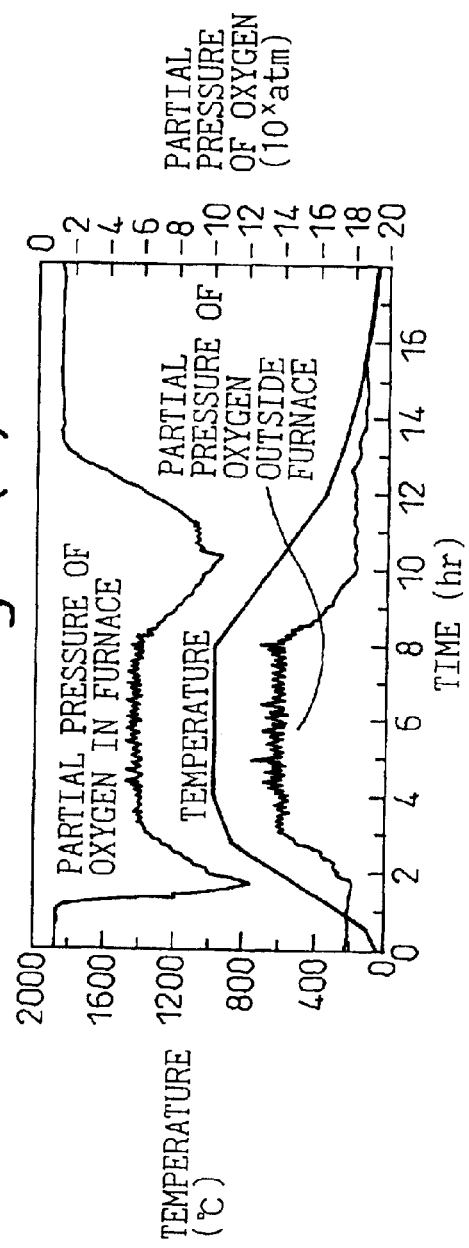

DIELECTRIC CERAMIC MATERIAL AND METHOD FOR PRODUCING THE SAME

BACKGROUND OF THE INVENTION

1. Field of the Invention

The present invention relates to a dielectric ceramic material that includes lead in the composition thereof, particularly a dielectric ceramic material that can be sintered at a low temperature and a method for producing the same, and an auxiliary oxide that makes it possible to sinter the dielectric ceramic material at a lower temperature.

2. Description of the Related Art

A dielectric ceramic material based on PZT (lead zirconate titanate) is useful as the material to make piezoelectric transformer, piezoelectric actuator or the like, but has drawbacks as the desired composition of a sintered material may not be obtained due to evaporation of lead oxide (PbO) in case the sintering temperature is high, and it is necessary to use an expensive high-melting point metal such as platinum (Pt) as the material to make an internal electrode leading to a high production cost. To circumvent these problems, various methods have been studied for sintering the dielectric ceramic material at a low temperature, which can be roughly divided into the following three groups.

① Method of adding glass
② Method of pulverizing calcined powder of dielectric material to decrease the particle size
③ Method of making the melting point of a liquid phase generating oxide of dielectric material lower Among these, the method ① that adds glass having a low melting point to the dielectric material so as to lower the sintering temperature has a great effect of lowering the sintering temperature but also decreases the dielectric constant of the dielectric material by adding glass thereto. There is also a problem in that the inclusion of a glass that has lower strength decreases the product strength.

The method ② improves the reactivity of particles by pulverizing the calcined powder of the dielectric material into fine powder by means of a mill or the like, thereby making it possible to sinter the material at a lower temperature, and is disclosed in, for example, Japanese Unexamined Patent Publication No. 7-277822, Japanese Unexamined Patent Publication No. 8-104568 and Japanese Unexamined Patent Publication No. 9-278535. However, sintering temperatures of PZT materials are generally in a range from 1100 to 1200° C., and the decrease in the sintering temperature that can be achieved by method ② is about 100° C. at the most. In order to allow for the use of less expensive silver (metal Ag) as the electrode material, the sintering temperature must be 950° C. or lower. If Pd is added to the Ag, the sintering temperature must be 980° C. or lower. Thus the effect of decreasing the sintering temperature by the method ② is insufficient.

The method ③ decreases the melting point of liquid phase generating oxide that forms a liquid phase when sintering the dielectric material. In the case of PZT, for example, the composition of the dielectric material after calcination is a mixture of lead titanate ($PbTiO_3$), lead zirconate ($PbZrO_3$) and lead zirconate titanate ($Pb(Ti_{0.5}Zr_{0.5})O_3$), and a trace of the PbO that did not contribute to the reaction of generating $PbTiO_3$ and $PbZrO_3$ during calcination forms a liquid phase during the sintering process. This liquid phase is considered to react with $PbTiO_2$ and $PbZrO_2$, through contact therewith, so that the sintering of $Pb(Ti_{0.5} Zr_{0.5})O_3$ proceeds. Thus sintering at a low temperature is made possible by adding an oxide that lowers the melting point of PbO in the process of preparing the stock powder, thereby to form the liquid phase at a lower temperature.

However, the method ③ cannot control the quantity of the liquid phase generating oxide, namely PbO that did not contribute to the reaction of generate $PbTiO_3$ and $PbZrO_3$. Therefore, there arises such a problem that the sintering temperature varies when there is a slight change in the producing condition. While the liquid phase generating temperature changes in accordance with the ratio of PbO to the low-melting point oxide during sintering, this ratio cannot be controlled and therefore the temperature cannot be controlled to such a level that sintering of the dielectric material is effectively accelerated. In addition, although there will be no problem if the oxide to be added lies in the grain boundary that has no relation to the composition of the dielectric material after sintering, in reality the oxide has a possibility of being included in the composition of the dielectric material and therefore may deteriorate the product performance when allowed to remain in the sintered material in a significant quantity.

SUMMARY OF THE INVENTION

The present invention has been devised to solve the problems described above. An object of the present invention is to provide a dielectric ceramic material that can be sintered at a lower temperature than that employed in the prior art while making it possible to control the sintering temperature of the dielectric material by controlling the quantity of liquid phase to be formed and prevent deterioration of the performance of the dielectric material due to the inclusion of additives into the dielectric material structure after sintering. Another object of the present invention is to provide an auxiliary oxide that helps make the dielectric material and a method for producing the dielectric material, having high performance with satisfactory controllability, by using the auxiliary oxide.

According to a first aspect of the invention, a low-temperature sintered dielectric ceramic material is provided that has main component of a composition of $ABO_3$ type dielectric ceramic material where a 0.9 molar ratio or more of lead is included in site A assuming the proportion of site B is 1, and at least one of tungsten and molybdenum is included therein. Density of the dielectric ceramic material after sintering is 7.5 $g/cm^3$ or larger, and the content of tungsten and molybdenum combined is less than 0.098 mole in proportion to 1 mole of lead.

In the low-temperature sintered dielectric ceramic material of the invention, tungsten and molybdenum are added as the auxiliary oxide. When the dielectric ceramic material is sintered, these auxiliary oxides melt at temperatures from 730 to around 980° C., so as to form a liquid phase in the ceramic material. The liquid phase provides a path for the migration of substances between ceramic particles, thereby to accelerate the reaction among particles and growth of the particles, thus making it possible to sinter the material at a lower temperature. Tungsten and molybdenum in the state of an oxide are in a eutectic relationship with lead included in the dielectric ceramic material. Use of the auxiliary oxide comprising a mixture of these materials makes it possible to control the liquid phase generating temperature by means of the mix proportion and to control the quantity of liquid phase generated by means of the quantity of the auxiliary oxide added, so that the sintering temperature can be controlled easily. As the particles grow, the liquid phase is expelled to the grain boundary and moves between the particles, eventually to be removed when reaching the surface of the sintered material as the sintering of the ceramic material proceeds.

Thus sintering can be achieved at a lower temperature than in the prior art, and a high density, of 7.5 g/cm$^3$ or higher, can be achieved after sintering. While the composition may change after sintering, as lead is susceptible to evaporation, lead has an effect of decreasing the sintering temperature and preventing the composition from changing, and the auxiliary oxide with lead added thereto is useful also as a source of lead. By setting the content of tungsten and molybdenum combined to less than 0.091 mole to 1 mole of lead, a decrease in the performance of the ceramic material due to residual auxiliary oxide can be suppressed. Moreover, it is made possible to use internal electrodes made of a low-melting point metal such as Ag—Pd, metal Ag, Cu alloy or the like provided in an inner layer and decrease the cost since shrinkage is completed at a temperature not higher than 980° C.

According to a second aspect of the invention, tungsten and molybdenum are included in a higher concentration in the grain boundary than within the particles of the dielectric ceramic material. Since tungsten and molybdenum are added in the form of the auxiliary oxide and are concentrated in the grain boundary, influence thereof on the performance of the dielectric material can be made smaller.

A third aspect of the invention is a layered dielectric device that has a layered structure where electrode layers made of a material including copper as a major component having melting point not higher than 1083° C. or electrode layers made of a material including silver or silver and palladium as the major component are interposed between layers of low-temperature sintered dielectric ceramic material. The dielectric ceramic material of the first or second aspect can be sintered simultaneously with the electrode layers having low melting point, thus greatly reducing the production cost of the device.

A fourth aspect of the invention is a method for producing the low-temperature sintered dielectric ceramic material described above, wherein an auxiliary oxide is used that is made by adding the oxide of at least one of tungsten and molybdenum to lead oxide in the following proportions.

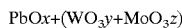

$PbOx+(WO_3y+MoO_3z)$ where $x+y+z=1$, $0.005<y+z<0.4$ and $y, z \geq 0$.

0.5 mol % to 20 mol % of this auxiliary oxide is added to a mixture of a stock material of dielectric ceramic material or calcination thereof that has a composition of $ABO_3$ type dielectric ceramic material where 0.9 molar ratio or more lead is included in site A assuming the proportion of site B is 1, and the material is mixed, formed and sintered.

The auxiliary oxide melts at a temperature from 730 to around 980° C., so as to form liquid phase in the ceramic material during the sintering process. The liquid phase provides a path for the migration of substances between ceramic particles, thereby to accelerate the reaction among particles and growth of particles, thereby making it possible to sinter the material at a lower temperature. By making the auxiliary oxide of the invention comprising the mixture of PbOx and ($WO_3+MoO_3$) in the proportions described above, it is made possible to decrease the liquid phase generating temperature and also to control the quantity of liquid phase generated by means of the quantity of the auxiliary oxide added, thereby making it possible to sinter at a lower temperature. As the particles grow, the liquid phase is expelled to the grain boundary and moves between the particles, eventually to be removed upon reaching the surface of the sintered material as the sintering of the ceramic proceeds.

Since the dielectric ceramic material that is sintered with the auxiliary oxide added thereto is sintered at a low temperature at which lead oxide does not evaporate and the auxiliary oxide hardly remains in the particles, the desired dielectric characteristics can be obtained. Particularly when the added quantity is in a range from 0.05 to 20 mol %, the sintering temperature can be decreased while maintaining the desired dielectric characteristics and strength. When the auxiliary oxide is added to calcined powder, it is made easier to control the quantity of the auxiliary oxide added to the calcined powder so that the auxiliary oxide including PbOx and $WO_3$ mixed in the predetermined ratio is uniformly dispersed in the calcined powder with the liquid phase being generated at a desired temperature and sintering carried out under satisfactory precision of control.

According to the method of a fifth aspect of the invention, the auxiliary oxide is made by adding the oxide of at least one of tungsten and molybdenum to lead oxide in dry or wet mixing process, or crushing a material made by calcination of the mixture that is prepared in a dry or a wet process. While PbOx, $WO_3$ and $MoO_3$ may be simply mixed in the form of powder, more stable control is enabled by turning the substances into a solid solution through calcination.

According to the method of a sixth aspect of the invention, the quantity of lead included in the stock mixture is set to the required quantity minus the quantity supplied from the lead oxide included in the auxiliary oxide, in the process of preparing the stock mixture so as to make the dielectric ceramic material. Since the auxiliary oxide includes lead oxide that constitutes the dielectric ceramic material, excess lead oxide does not remain in the sintered material and the material cost can be reduced by decreasing the quantity of lead included in the stock mixture by the quantity supplied from the auxiliary oxide when preparing the stock material.

According to the method of a seventh aspect of the invention, the auxiliary oxide used is such that melting point thereof lies in a range from a temperature at which shrinkage ratio of the dielectric ceramic material is 3% to a temperature at which the shrinkage stops. When a preform having inner electrodes and the like formed therein is sintered, if a liquid phase is generated from the auxiliary oxide in a stage where shrinkage of the dielectric ceramic material is still small, the electrodes are subjected to stress and may peel off. In order to prevent this from occurring, the auxiliary oxide, of which the melting point is not lower than the temperature at which shrinkage ratio of the dielectric ceramic material is 3%, may be used, and effective sintering can be achieved by forming the liquid phase before reaching the temperature at which the shrinkage stops.

According to the method of an eighth aspect of the invention, a sheet made by adding the auxiliary oxide to the stock powder or calcined powder of the stock powder is used when forming the dielectric ceramic material into sheet, and an electrode layer is printed and laminated thereon with the sheet and the electrode layer being sintered at the same time. Adding the auxiliary oxide to the material of electrode leads to the generation of liquid phase that has an effect of preventing the electrode from peeling off under the stress.

A ninth aspect of the invention is an auxiliary oxide to be used as an additive when sintering a ceramic material, and is made by adding the oxide of at least one of tungsten and molybdenum to lead oxide, while the content of tungsten and molybdenum combined is set in a range from 0.5 mol % to 40 mol %.

When the auxiliary oxide comprising the mixture of PbOx and (WO$_3$+MoO$_3$) in the proportions described above is added to the dielectric ceramic material, it is made possible to decrease the liquid phase generating temperature and sinter the material at a lower temperature. Also because the quantity of liquid phase generated can be controlled by means of the quantity of the auxiliary oxide added, it becomes easier to control the sintering temperature without compromising the performance of the dielectric material.

The auxiliary oxide of a tenth aspect of the invention is made by adding the oxide of at least one of tungsten and molybdenum to lead oxide and subjecting the mixture to calcination with the content of tungsten and molybdenum combined being set in a range from 0.5 mol % to 40 mol %. The auxiliary oxide of a tenth aspect of the invention forms solid solution of PbO and (WO$_3$+MoO$_3$) with the composition made more uniform, so as to be dispersed in the ceramic material and form the liquid phase at a desired temperature, thus making it possible to carry out sintering more effectively.

BRIEF DESCRIPTION OF THE DRAWINGS

FIG. 3 is a shrinkage curve of the dielectric material during sintering.

FIG. 11(a) shows target changing pattern of the temperature and partial pressure of oxygen, FIG. 11(b) shows actual changing pattern of the temperature and partial pressure of oxygen and FIG. 11(c) shows an area in the plane of temperature and partial pressure of oxygen where oxidation of Cu and reduction of PbO occur.

DESCRIPTION OF THE PREFERRED EMBODIMENTS

Figure 1:
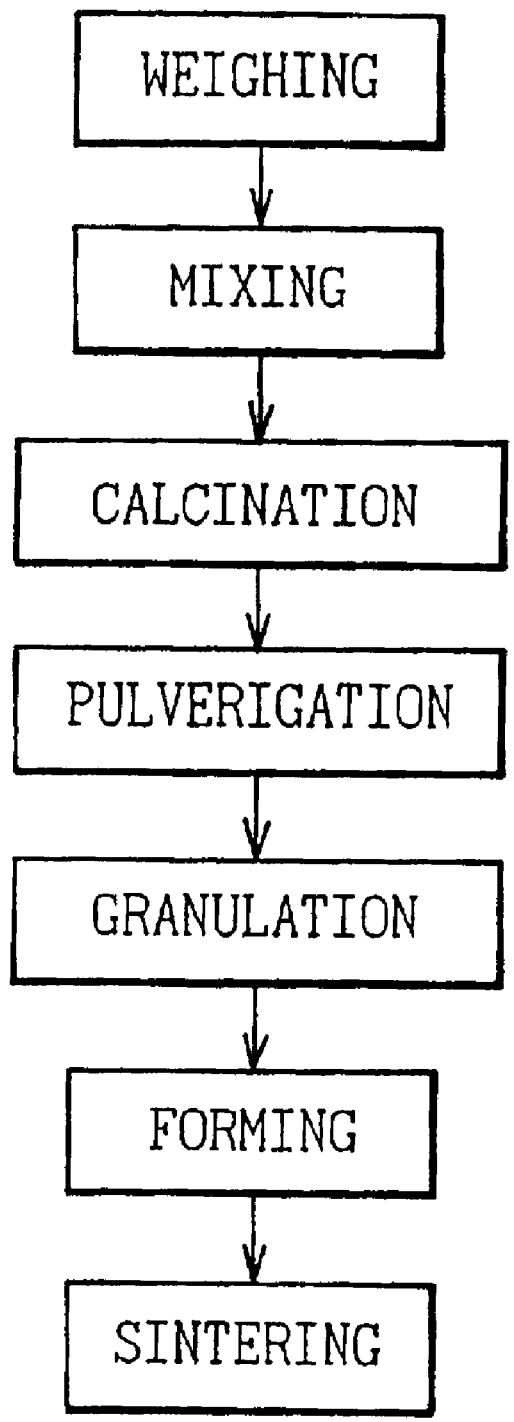
FIG. 1 shows a process of producing a dielectric ceramic material.

Now the present invention will be described in detail below. A low-temperature sintered dielectric ceramic material has a composition of ABO$_3$ type dielectric ceramic material where 0.9 molar ratio or more lead is included in site A assuming the proportion of site B is 1, and at least one of tungsten and molybdenum is included. For the main component, PZT ceramics of Pb(Ti, Zr)O$_3$ or a derivative thereof having a part thereof being substituted with an element such as Sr, Mn, Y, Nb or the like is preferably used, which shows good dielectric characteristics. A specific composition including the substituting element and the mix proportions of the component elements may be selected according to the desired characteristics. While the component elements of the ABO$_3$ type dielectric ceramic material are normally mixed in proportions of A:B:O=1:1:3 in molar ratio, an excess of lead may be included at site A so that total content of the components at site A including lead becomes 1.00 mole for 1 mole of site B. This is for the purpose of making it easier to form the liquid phase at a low temperature by including an excessive amount of lead that has a low melting point, or to prevent variation in the composition after sintering that tends to occur because lead is liable to evaporate.

According to the present invention, by sintering the dielectric ceramic material that includes lead, such as a PZT ceramic material, by using the auxiliary oxide that includes at least one of tungsten and molybdenum, it is made possible to sinter at a low temperature and a density of the dielectric ceramic material, after sintering, of 7.5 g/cm$^3$ or higher can be achieved. In order to achieve the effect of decreasing the sintering temperature while maintaining good dielectric characteristics, proper amounts of tungsten and molybdenum included in the state of oxide in the relation of eutectic with lead must be set properly. Specifically, total content of tungsten and molybdenum included in the dielectric ceramic material after sintering is set to 0.098 mole or less for 1 mole of lead. Tungsten and molybdenum promote the growth of particles through formation of a liquid phase during sintering, while the liquid phase is expelled to the grain boundary as the particles grow, and therefore exists in the grain boundary in a higher concentration than in the particles of the dielectric ceramic material.

The auxiliary oxide is used as an assisting agent for sintering the dielectric ceramic material, and consists of at least one of lead oxide (PbO), tungsten oxide (WO$_3$) and molybdenum oxide (MoO$_3$). Both of WO$_3$ and MoO$_3$ may be added, as a matter of course. The total content of WO$_3$ and MoO$_3$ included in the auxiliary oxide is in a range from 0.5 mol % to 40 mol %, specified by the following formula.

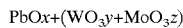

PbOx+(WO$_3$y+MoO$_3$z)

where x+y+z=1, 0.005<y+z<0.4 and y, z≧0.

When the total content of WO$_3$ and MoO$_3$ is out of the range described above, the melting point of the low melting point phase becomes not lower than 980° C., and the effect of decreasing the sintering temperature of the base material cannot be achieved.

The auxiliary oxide may be prepared by weighing and mixing the stock powders so that proportions of PbO and (WO$_3$+MoO$_3$) fall in the range described above. While the mixing process may be a dry process, a wet mixing process in which the powders are dispersed in water or the like is more desirable. The mixture is preferably pulverized by means of ball mill or the like so as to decrease the particle size of the mixed powder in order to increase the reactivity, although the pulverization process is not necessarily required. Preferably, calcination is carried out at temperatures from 270 to 730° C. after pulverization so as to obtain calcined powder of which a part has reacted, thereby to produce the auxiliary oxide. Calcination produces the solid solution of the auxiliary oxide that melts at a desired temperature, and achieves the effect of stabilizing the liquid phase precipitation temperature. Calcined powder of the auxiliary oxide is further pulverized with a ball mill or the like to achieve a desired particle size. Calcination of the auxiliary oxide in the stage of preparation thereof may be omitted since calcination proceeds during the sintering process after mixing the auxiliary oxide and the stock material of the dielectric ceramic material.

According to the present invention, the auxiliary oxide is added in order to promote sintering of the dielectric ceramic material that includes lead such as PZT ceramic material at a low temperature. FIG. 1 shows the process of producing the dielectric ceramic material. The auxiliary oxide may be added and mixed in the process of (2) where the stock compounds of the dielectric ceramic material that was weighed in the process of (1) are mixed, although adding the auxiliary oxide after calcination of the mixed powder in the process (3) is more preferable since this makes it easier to control the proportion of the quantity of the auxiliary oxide to the calcined powder. Calcination of the dielectric ceramic material is typically carried out at a temperature from 500 to 900° C., while the calcined powder obtained in the process (4) is dispersed in water together with a binder and a dispersant and, with the pulverized powder of the auxiliary oxide added thereto, is mixed and pulverized. The quantity of the auxiliary oxide added is set in a range from 0.05 to 20 mol % to the calcined powder. The effect of decreasing the sintering temperature cannot be achieved when the quantity of addition is less than 0.05 mol %, and the density decreases when the quantity is more than 20 mol %. While the sintering temperature can be made lower by adding a greater amount of the auxiliary oxide higher than 0.05 mol %, adding more than 6 mol % results in decreased strength and longer sintering time required to achieve the desired characteristics. Therefore, the quantity of auxiliary oxide added is preferably in a range from 0.05 to 6 mol %. This quantity of addition is given in terms of the proportion to the quantity of the calcined material, also in the case of adding the auxiliary oxide to the stock powder when making the dielectric ceramic material.

After mixing the calcined powder of the dielectric ceramic material and the auxiliary oxide, granules are formed by a common method in process (5). The granules are, after being dried, formed and sintered in processes (6) and (7), respectively. The auxiliary oxide may be added also in the granulation process (5) as well as in the process (4) where the calcined powder of the dielectric ceramic material is pulverized. While the sintering temperature depends on the ratio of $PbO/(WO_3+MoO_3)$ in the auxiliary oxide and the quantity of auxiliary oxide added, normally it is desired to sinter at a temperature from 730 to 1100° C. in an air atmosphere. In this process, it is desirable to place a powder of zirconium oxide ($ZrO_2$), lead zirconate ($PbZrO_3$) or the like around the preform, so that liquid phase product precipitating on the surface after sintering can be removed through reaction.

Figure 2:
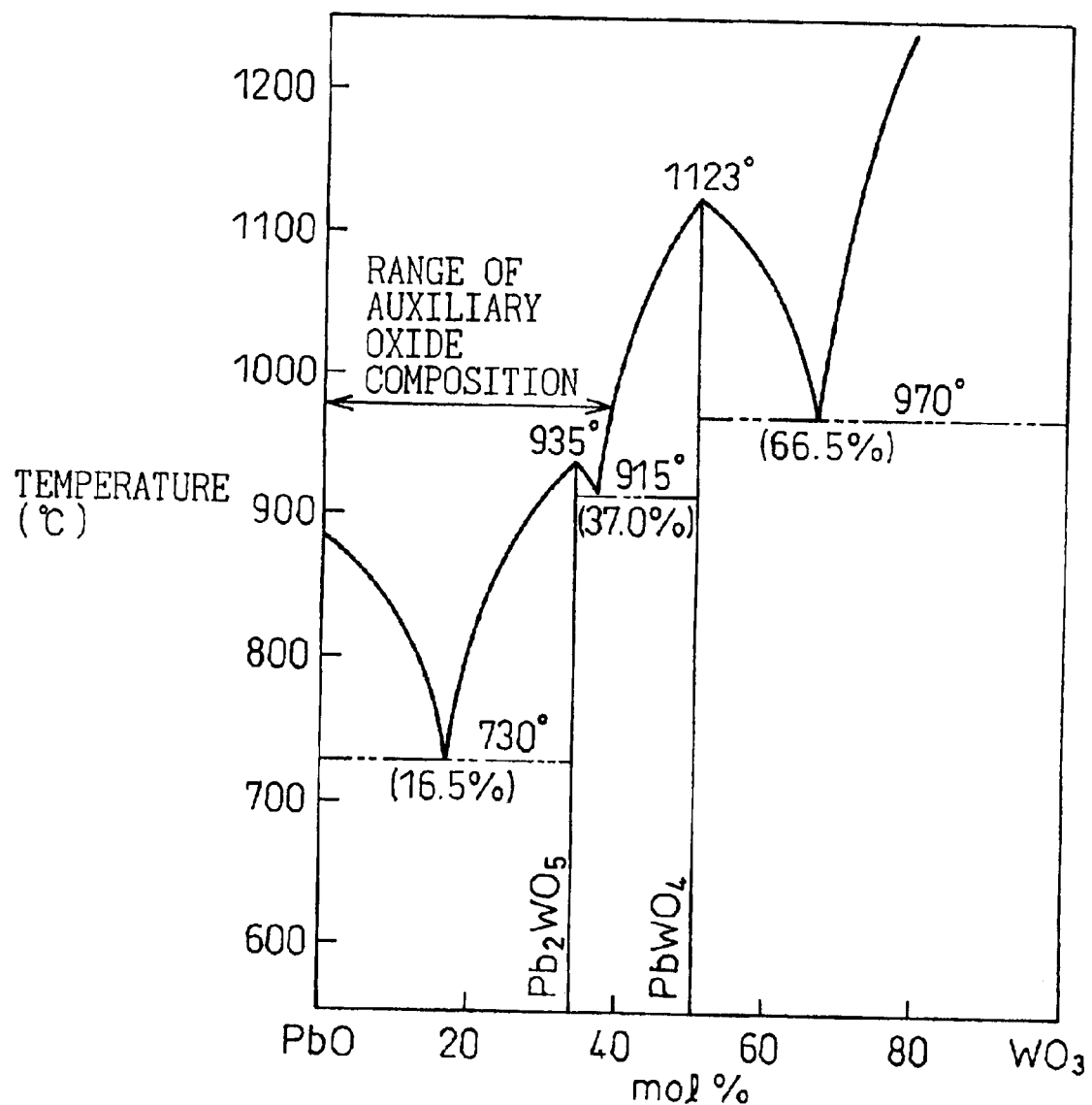
FIG. 2 is a state diagram of PbO—WO$_3$ binary system.

According to the present invention, since the auxiliary oxide consisting of PbO and ($WO_3+MoO_3$) mixed thereto in a predetermined proportion is added during calcination of the PZT dielectric ceramic material, nucleuses of a liquid phase having the desired low melting point can be dispersed in the PZT composite material. When a mixture of the calcined powder of dielectric material and the auxiliary oxide is sintered in the air, the auxiliary oxide melts at a temperature above 730° C. so that a trace of liquid phase exists in a large quantity of the calcined powder of dielectric material. The liquid phase provides a path for the migration of substances between ceramic particles so as to react with each other and produce the dielectric material. The liquid phase also accelerates the growth of particles of the dielectric material, and is expelled to the grain boundary and moves between the particles as the particles grow. FIG. 2 is a state diagram of $PbO—WO_3$ system, which shows that the composite material has a melting point determined by the proportions of PbO and $WO_3$ and the melting point is the lowest (730° C.) when 16.5 mol % of $WO_3$ is included. A similar trend is observed when $WO_3$ is replaced by $MoO_3$.

As described above, sintering of the entire material proceeds as the liquid phase repeats contact and reaction with the dielectric material particles, growth of particles and migration, while it is made possible to sinter the PZT dielectric ceramic material at a low temperature at which PbO does not evaporate by controlling the ratio of $PbO/(WO_3+MoO_3)$ and the quantity of addition. Upon reaching the surface of the sintered body, the liquid phase reacts with ZrO and is removed from the sintered body. Since the liquid phase hardly remains in the sintered body, there is no significant influence on the dielectric characteristics. While Pb included in the dielectric material is supplied excessively from the auxiliary oxide, it is made possible to prevent excess PbO from remaining in the sintered material and to reduce the material cost by decreasing the quantity of PbO by the quantity supplied from the auxiliary oxide. In case the dielectric material includes excessive Pb, quantity PbO is increased accordingly.

In order to use the dielectric material obtained as described above for piezoelectric transformer or the like, mixed powder of the auxiliary oxide and the dielectric material is formed in a predetermined shape and an electrode layer is printed and laminated thereon with the lamination being sintered at the same time. The material can be sintered at a low temperature not higher than 980° C. by controlling the composition of the dielectric material, the ratio of $PbO/(WO_3+MoO_3)$ included in the auxiliary oxide and the quantity of the auxiliary oxide added. Also, because less expensive silver (metal Ag), silver-palladium, copper or copper alloy having melting point of 1083° C. or lower that includes copper as the main component can be used as the conductor, the production cost can be reduced.

When the laminated body having the internal electrodes is sintered as described above, interlayer peel-off may occur after sintering depending on the type of auxiliary oxide used. This trouble tends to occur when the nucleus of a liquid phase are generated before the dielectric material shrinks by 3%, and is supposedly caused by stress that is generated in the surface of the inner electrode due to uneven shrinkage resulting from non-uniform nucleation of a liquid phase. Therefore, in order to prevent peel-off from occurring, such an auxiliary oxide is preferably selected that has a composition of which melting point is in a range from a temperature at which shrinkage ratio of the dielectric ceramic material is 3% to a temperature at which the shrinkage stops. The effect of preventing peel-off can be increased by adding the auxiliary oxide of the same composition as the material of the internal electrode.

Preferred Embodiments

High-purity powders of lead oxide and tungsten oxide were weighed as the stock materials for the auxiliary oxide in mix proportions of 83.5 mol % of PbO and 16.5 mol % of $WO_3$. After dry mixing of these powders, the mixture was calcined at 500° C. in air atmosphere for two hours, thereby to obtain calcined powder of the auxiliary oxide (chemical formula: $Pb_{0.825}\ WO_{0.165}O_{1.23}$) wherein a part of the PbO and the $WO_3$ have reacted. The calcined powder of the auxiliary oxide was pulverized into smaller particles by means of a mill and dried to thereby obtain an auxiliary oxide powder that has higher reactivity.

For the dielectric ceramic material, high-purity powders of stock materials such as lead oxide, strontium oxide, zirconium oxide, titanium oxide, yttrium oxide, niobium oxide and manganese oxide were weighed so as to obtain the composition of $(Pb_{0.91}\ Sr_{0.09})\ \{Zr_{0.533}Ti_{0.452}(Y_{0.5}Nb_{0.5})_{0.01}\}O_3+0.5$ atm % $Mn_2O_3$. After dry mixing of these powders, the mixture was calcined at 850° C. in air atmosphere for seven hours, thereby to obtain calcined powder of the dielectric material. 4.7 kg of the calcined dielectric material powder was poured, little by little, into a mixture of 2.5 liters of water and a dispersant (2.5% by weight of the calcined dielectric material powder) that had been prepared in advance, and was mixed therewith to make a slurry of calcined dielectric material powder. The slurry of calcined dielectric material powder was mixed and pulverized by means of a pearl mill so as to control the particle size within 0.2 μm.

A binder in a proportion of 4% by weight of the calcined dielectric material powder, a mold release agent in a proportion of 1.9% by weight of the calcined dielectric material powder and the auxiliary oxide in a proportion of 13.5 g $(PbO_{0.835}WoO_{0.165}O_{1.33}$: 0.5 mol %) to 1600 g of the calcined dielectric material powder were added to the slurry of calcined dielectric material powder that was being pulverized in the mill, and was stirred for three hours. Then the slurry was dried with a spray drier to obtain a granulated powder of the calcined dielectric material. The granulated powder thus obtained was pressed under a pressure of 3.27 g/cm² so as to obtain a preform measuring 20 mm in diameter and 1 mm in thickness.

The preform was put into a sagger made of magnesia and surrounded by lead zirconate ($PbZrO_3$). The crucible was put into a furnace and was heated to 950° C. in air atmosphere for four hours, thereby to obtain sintered dielectric material. After lapping the sintered body, silver paste was printed on both surfaces and sintered at 680° C. to form the electrodes. Then the piece was polished on the periphery to make the dimensions 13 mm in diameter and 0.5 mm in thickness, and was polarized with 0.9 kV in a silicone oil bath heated to 130° C. for 30 minutes, thereby to obtain the dielectric material (sample 1).

The dielectric ceramic material obtained as described above had a density of 7.62 (g/cm³) and piezoelectric constant $d_{31}$ of $1.51\times10^{10}$ (m/V). Since the material without auxiliary oxide added thereto showed a density of 7.62 (g/cm³) and piezoelectric constant $d_{31}$ of $1.62\times10^{10}$ (m/V) after sintering at 1050° C., it can be seen that addition of the auxiliary oxide makes it possible to sinter the dielectric ceramic material at a lower temperature while maintaining high density and satisfactory piezoelectric characteristic. A measurement of tungsten content in the dielectric ceramic material showed that Pb:W=1:0.0009 to 0.0004 (molar ratio).

An auxiliary oxide (chemical formula: $PbO_{0.535}MoO_{0.165}O_{1.33}$) was made similarly to that described above except that $MoO_3$ was used instead of $WO_3$ as the stock material for the auxiliary oxide. This auxiliary oxide in proportion of 13.5 g (0.5 mol %) was mixed with 1600 g of the calcined dielectric material of the same composition. The mixture was formed, sintered, provided with electrodes baked thereon and polarized, thereby to obtain the dielectric material (sample 2).

The dielectric ceramic material obtained as described above had a density of 7.64 (g/cm³) and piezoelectric constant $d_{31}$ of $1.49\times10^{10}$ (m/V). Measurement of molybdenum content in this dielectric ceramic material showed proportions of Pb:Mo=1:0.0005 to 0.0015 (molar ratio). Thus it was verified that the effects of forming a phase of low melting point and promoting low-temperature sintering similar to those described above can be achieved also when molybdenum oxide is used instead of tungsten oxide.

A sample was made by sintering, similar to sample 1, except for changing the proportions of PbO and $WO_3$ in the auxiliary oxide and setting the quantity of the auxiliary oxide added to 3 mol %. Influence of the mix proportion on the sintering temperature was studied with the results shown in Table 1. Sintering temperature was measured with TMA analyzer. As shown in Table 1, the sintering temperature decreases as the proportion of $WO_3$ increases, reaching the lowest temperature when the ratio $PbO/WO_3$ is around 83/17. As the proportion of $WO_3$ increases further, sintering temperature rises again. This indicates that the effect of adding the auxiliary oxide on the sintering temperature (1050° C.) of the base material can be achieved by mixing $WO_3$ in proportion higher than 0.5 mol % and lower than 40 mol %.

TABLE 1

Sintering temperature of dielectric material + 3 mol % $[(PbO)_{1-x} + (WO_3)_x]$

| X | Sintering temperature (° C.) |
|---|---|
| 0 | 1050 |
| 0.005 | 1050 |
| 0.01 | 1010 |
| 0.03 | 990 |
| 0.17 | 920 |
| 0.25 | 1010 |
| 0.3 | 1030 |
| 0.4 | 1040 |
| 0.5 | 1100 |
| 0.665 | 970 |

A sample was also made by sintering a material, similar to the sample 1, such that the auxiliary oxide was made with constant proportions of 83.5 mol % of PbO and 16.5 mol % of $WO_3$ and was added to the dielectric material in quantity shown in Table 2. The sintering temperature at which a density comparable to that of the base material (0 mol % of auxiliary oxide added) is obtained, and the piezoelectric characteristic are shown in Table 2 and Table 3. As can be seen from Table 2, the sintering temperature can be made lower than that of the base material by adding 0.05 mol % of the auxiliary oxide, thus making it possible to sinter at a temperature of 1000° C. or lower with the addition of 0.1 mol %, and at a temperature of 950° C. or lower with the addition of 0.5 mol %. While the sintering temperature decreases as the quantity of auxiliary oxide added is increased, Table 3 shows that density of the sintered material decreases significantly when the addition exceeds 20 mol %. Thus it is better to set the concentration of the addition in a range from 0.05 to 20 mol %.

The ratio of Pb to tungsten concentrations in the dielectric material was measured for the sample 3 comprising the dielectric material with 20 mol % of the auxiliary oxide added thereto and the sample 4 comprising the dielectric material with 25 mol % of the auxiliary oxide added thereto, with the result of Pb:W=1:0.24 to 0.30 for sample 3 and Pb:W=1:0.37 to 0.40 for sample 4 in molar ratio. Thus it is shown that, in order to achieve the effects of the invention, it is necessary to set the molar ratio of tungsten to lead less than 0.30, and preferably set to not higher than 0.0009 or 0.0004 for lead being 1.

Table 3 shows that the piezoelectric constant decreases as the quantity of addition increases, which is supposedly because the auxiliary oxide has lower sintering temperature than the base material with the growth rate of the particles being decreased. In such a case, growth of the particles can be promoted by increasing the period of sintering. For example, when 0.5 mol % of the auxiliary oxide is added, piezoelectric characteristic comparable to or higher than that of the base material can be achieved by sintering for 6 or 8 hours as shown in Table 4.

TABLE 2

Properties of dielectric material + Y mol % [(PbO)$_{0.835}$ + (WO$_3$)$_{0.165}$]

| Y | Density (g/cm$^3$) when sintered for 4 hrs. | Sintering temperature (° C.) |
|---|---|---|
| 0 | 7.62 | 1050 |
| 0.02 | 7.6 | 1020 |
| 0.05 | 7.6 | 1000 |
| 0.1 | 7.58 | 960 |
| 0.2 | 7.61 | 950 |
| 0.5 | 7.62 | 920 |
| 1 | 7.61 | 910 |
| 1.5 | 7.56 | 910 |
| 3 | 7.61 | 910 |
| 6 | 7.52 | 910 |
| 12 | 7.52 | 910 |
| 18 | 7.52 | 910 |
| 20 | 7.50 | 910 |
| 25 | 7.47 | 910 |

TABLE 3

Properties of dielectric material + Y mol % [(PbO)$_{0.835}$ + (WO$_3$)$_{0.165}$]

| Y | Density (g/cm$^3$) when sintered for 4 hrs. | Piezoelectric constant d31 × 10$^{10}$ (m/V) |
|---|---|---|
| 0 | 7.62 | 1.62 |
| 0.02 | 7.6 | 1.62 |
| 0.05 | 7.6 | 1.6 |
| 0.1 | 7.58 | 1.58 |
| 0.2 | 7.61 | 1.55 |
| 0.5 | 7.62 | 1.51 |
| 1 | 7.61 | 1.47 |
| 1.5 | 7.56 | 1.38 |
| 3 | 7.61 | 1.12 |
| 6 | 7.52 | 0.64 |

TABLE 4

| Sintering time (hr) | Density (g/cm$^3$) | Sintering temperature (° C.) | Piezoelectric constant d31 × 10$^{10}$ (m/V) |
|---|---|---|---|
| 6 | 7.62 | 950 | 1.61 |
| 8 | 7.62 | 950 | 1.1 |

Figure 4A:
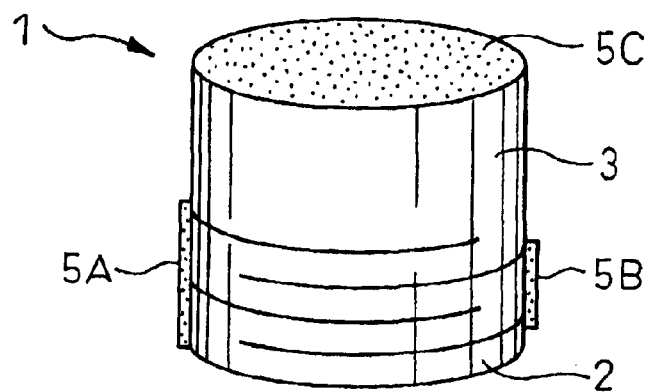
FIG. 4(a) is a schematic diagram showing the constitution of a laminated piezoelectric device using the dielectric material of the invention.
Figure 4B:
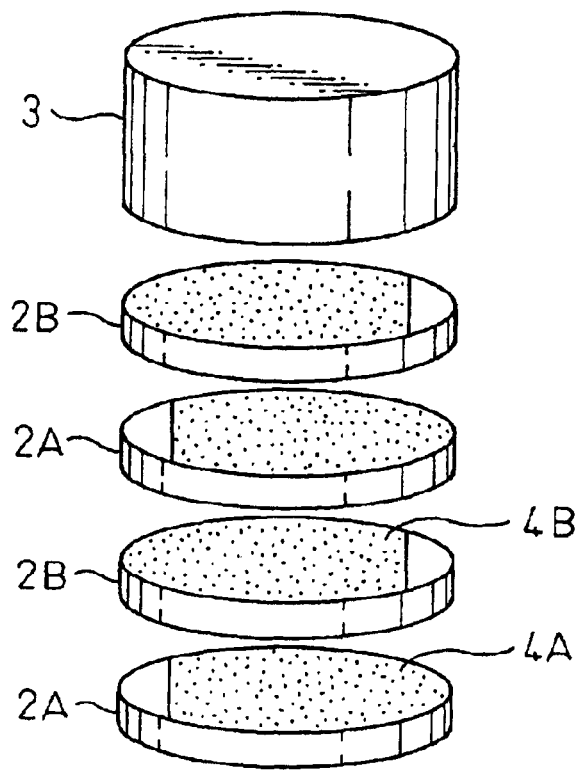
FIG. 4(b) is an exploded perspective view of FIG. 4(a).
Figure 5A:
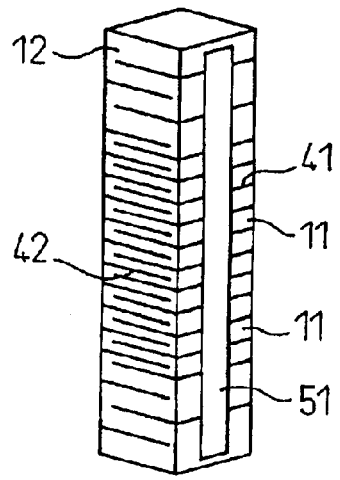
FIG. 5(a) is an overall perspective view of a piezoelectric actuator using the dielectric material of the invention.
Figure 5C:
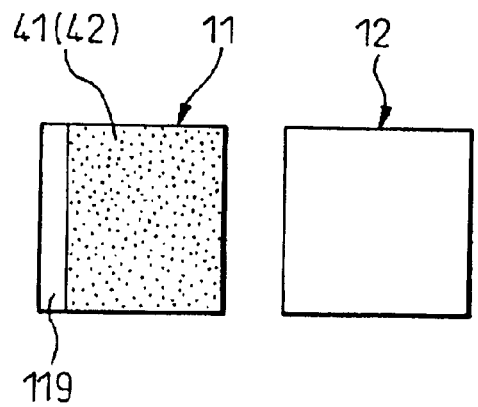
FIG. 5(c) is a front view of a sheet that constitutes the piezoelectric actuator and FIG. 5(d) is an exploded perspective view of the piezoelectric actuator.
Figure 5B:
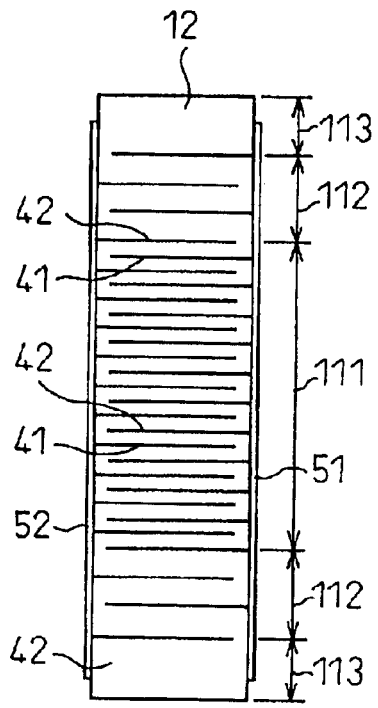
FIG. 5(b) is a schematic diagram showing the electric connection of the piezoelectric actuator.
Figure 5D:
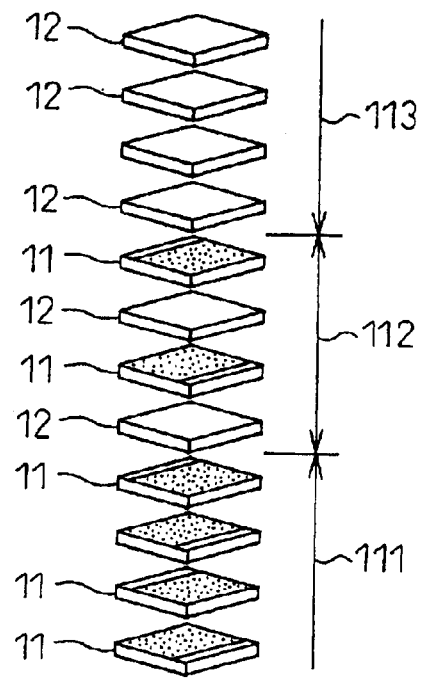

Calcined powder of the dielectric material was prepared by a method similar to that of sample 1, with a granulated powder thereof being mixed with the auxiliary oxide and formed by a forming apparatus, thereby to make four pieces of disk-shaped preform 2 measuring 20 mm in diameter and 1 mm in thickness and one piece of disk-shaped preform 3 measuring 20 mm in diameter and 4 mm in thickness as shown in FIG. 4(*a*). Laminated piezoelectric device 1 was made by using these pieces, in a procedure described below. First, internal electrodes were formed by printing patterns 4A and 4B on the upper surfaces of the four preform sheets 2 which were then placed alternately one on another and pressure-bonded as shown in FIG. 4(*b*). Ag paste was used to form the internal electrodes. The sheet having the pattern 4A is referred to as preform 2A and the sheet having the pattern 4B is referred to as preform 2B. Pressure bonding was carried out by using an ordinary press. The laminated body was sintered at 950° C. in air atmosphere for 4 hours, followed by the formation of external electrodes 5A, 5B from Ag paste thereby to make the laminated piezoelectric device 1 as shown in FIG. 4(*a*). The laminated piezoelectric device 1 can be used as a piezoelectric transformer after providing lead wires (not shown) thereto and applying polarization.

As another application, a piezoelectric actuator shown in FIG. 5(*a*) can also be made, that is, made by stacking rectangular preform sheets 11, 12 shown in FIG. 5(*c*) in a constitution shown in FIG. 5(*d*), where reference numeral 113 denotes a dummy section, 112 denotes a buffer section and 111 denotes a drive section. The rectangular preform sheet 11 has an electrode layer 41 or an electrode layer 42, having different pattern from each other except for a band portion 119, being printed on the surface thereof. Connection is made electrically in series and mechanically in parallel as shown in FIG. 5(*b*). By providing outer electrodes 51, 52 as shown in FIG. 5(*a*) and FIG. 5(*b*) and lead wires not shown, this stack is used as a piezoelectric actuator.

Interlayer peel-off after sintering was studied in samples having various proportions of the auxiliary oxide added to the granulated powder, with the results shown in Table 5. Two types of samples made from different primary particle sizes of the granulated powder were prepared and the occurrence of interlayer peel-off was compared between the different particle sizes. Shrinkage curves for the different particle sizes are shown in FIG. 3. Table 5 indicates that peel-off is more likely to occur when the melting point of the auxiliary oxide is lower and the particle size is larger with a lower shrinkage ratio. FIG. 3 indicates that the dielectric material shrinks before the nucleuses of a liquid phase are generated by the auxiliary oxide during sintering, although when the liquid phase is generated before shrinkage of 3% is completed, there occurs an unevenness in the progress of shrinkage of which intensity varies significantly from position to position because the nucleuses of a liquid phase are generated unevenly (due to temperature distribution), thus resulting in stress acting on the internal conductor surface that leads to peel-off. Therefore, in order to sinter without peel-off, an auxiliary oxide of such a composition may be selected with reference to the state diagram of FIG. 2 that has melting point in a range from a temperature at which shrinkage ratio of the dielectric ceramic material is 3% to a temperature at which the shrinkage stops in the shrinkage curve of FIG. 3. When an Ag—Pd conductor is used for the internal conductor, the sintering temperature is typically around 980° C. and the quantity of auxiliary oxide added is set below 980° C., namely in a range from 0.5 mol % to 40 mol %.

TABLE 5

| Material particle size (μm) | Melting point (° C.) of auxiliary oxide | 830 | 730 | 800 | 900 |
|---|---|---|---|---|---|
| | Composition PbO/WO$_3$ | 90/10 | 83.5/16.5 | 78/22 | 70/30 |
| 1.22 | Peel-off | Δ | X | Δ | ○ |
| | Shrinkage (%) at the start of melting | 2.5 | 0 | 1.6 | 6.2 |
| 0.54 | Peel-off | ○ | X | ○ | ○ |
| | Shrinkage (%) at the start of melting | 3.8 | 1.4 | 3.2 | 8.2 |

○: No peel-off
Δ: Less than 5% peeled off
X: 5% or more peeled off

By properly selecting the auxiliary oxide as described above, low-temperature sintering is made possible without compromising the performance of the base material and a high-performance dielectric device can be obtained while preventing interlayer peel-off from occurring in the laminated body. A similar laminated piezoelectric device 1 was made by adding the auxiliary oxide of the same composition to the material of the internal electrode, with the result of peel-off occurrence being decreased further.

While Ag was used for the internal conductor in the embodiment described above, similar effects can be achieved by using a conductor that is constituted mainly from Cu. An embodiment of making the laminated piezoelectric device 1 with Cu used as the internal conductor will be described below.

The auxiliary oxide to be added to the dielectric ceramic material was made, similarly to the sample 1 described above (chemical formula: $Pb_{0.325}$ $WoO_{0.165}O_{1.33}$). Stock material powders were mixed and calcined so as to obtain calcined powder of dielectric material with final composition of $(Pb_{0.91} Sr_{0.09}) \{Zr_{0.533}Ti_{0.452}(Y_{0.5}Nb_{0.5})_{0.01}\} O_3 + 0.5$ atm % $Mn_2O_3$. A slurry of calcined dielectric material powder made from this calcined dielectric material powder was mixed with 0.5 mol % of the auxiliary oxide added thereto (13.5 g of auxiliary oxide to 1600 g of calcined dielectric material powder). The mixture was dried with a spray drier so as to obtain a granulated powder of calcined dielectric material.

A solvent, binder, dispersant and the like were added to the granulated powder, and it was mixed and pulverized by means of a ball mill for a whole day so as to decrease the particle size, then deaerated in vacuum. A green sheet was formed by means of a doctor blade apparatus with blade intervals of 125 $\mu$m. The green sheet was dried at 80° C. and cut with a sheet cutter into a predetermined number of sheets of the same shape measuring 100 mm and 150 mm.

Then 1.11 g of Cu powder (1050YP) manufactured by Mitsui Metal and 0.09 g of an additive powder were added to 1800 g of CuO paste (CuO content 50% by weight and specific surface area of CuP 10 m²/g) and mixed in a centrifugal mixing deaerator thereby to make an electrode paste. The additive powder has the same composition as the auxiliary oxide, and is used for the purpose of improving the bonding strength between the electrode layer and the dielectric material layer and to match the shrinkage between the electrode layer and the dielectric material layer.

With the electrode paste being applied to the upper surface of the sheets, by means of a screen printing apparatus, in a predetermined pattern having a thickness of 5 to 8 $\mu$m, the sheets were dried at 130° C. for one hour. 20 sheets having the electrodes printed thereon were laminated and three dummy sheets without electrodes were laminated on the top and the bottom. The stack was fastened on a pressurization fixture and thermally bonded with a pressure of 80 kg/m² applied for 10 minutes at 120° C., thereby to obtain a mother block. The mother block was cut to a size of 9 mm by 9 mm.

While the mother block was cut into size of 9 mm by 9 mm in this embodiment, the effects of the present invention can be achieved with mother block of other sizes as long as the size is not smaller than 2 mm by 2 mm. Also, the number of sheets laminated, 20 in the example described above, may be set freely.

Figure 6A:
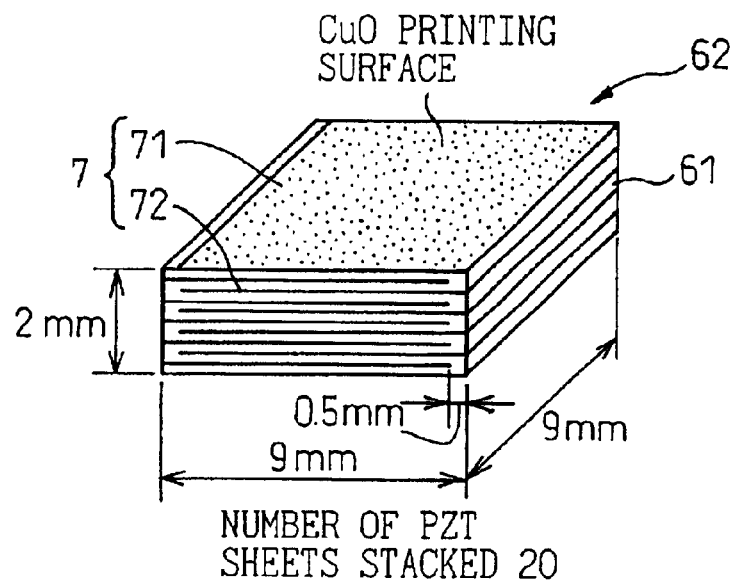
FIG. 6(a) is a schematic perspective view showing the constitution of a lamination unit.
Figure 6B:
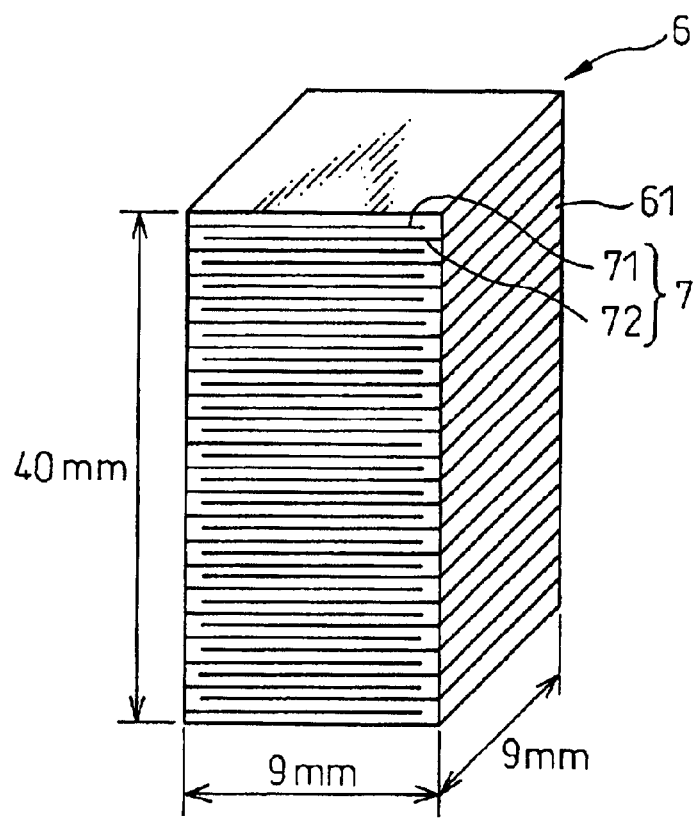
FIG. 6(b) is a schematic perspective view showing the constitution of a laminated body made by stacking the lamination units.

The stack was then thermally bonded again by means of a laminating apparatus with a pressure of 160 kg/m² applied for 10 minutes at 120° C., thereby to obtain a laminate unit 62 comprising dielectric material sheet 61 and internal electrode layers 7 as shown in FIG. 6(a). The internal electrode layer 7 consists of an electrode layer 71 of printed pattern having the electrode exposed on the right side face and an electrode layer 72 of printed pattern having the electrode exposed on the left side face that are placed alternately one on another. 20 pieces of the laminate unit 62 were laminated and thermally bonded again by means of a laminating apparatus with a pressure of 500 kg/m² applied for 10 minutes at 80° C., thereby to obtain a laminated body 6 comprising dielectric material sheet 61 and the internal electrode layers 7 as shown in FIG. 6(b).

Figure 7A:
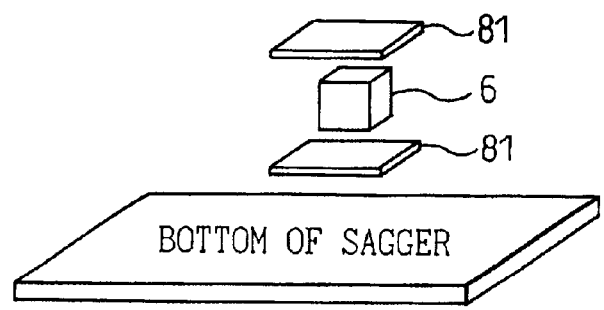
FIG. 7(a) is an exploded perspective view showing the constitution of fixtures in a degreasing process and FIG. 7(b) shows a pattern of changing the degreasing process temperature.
Figure 7B:
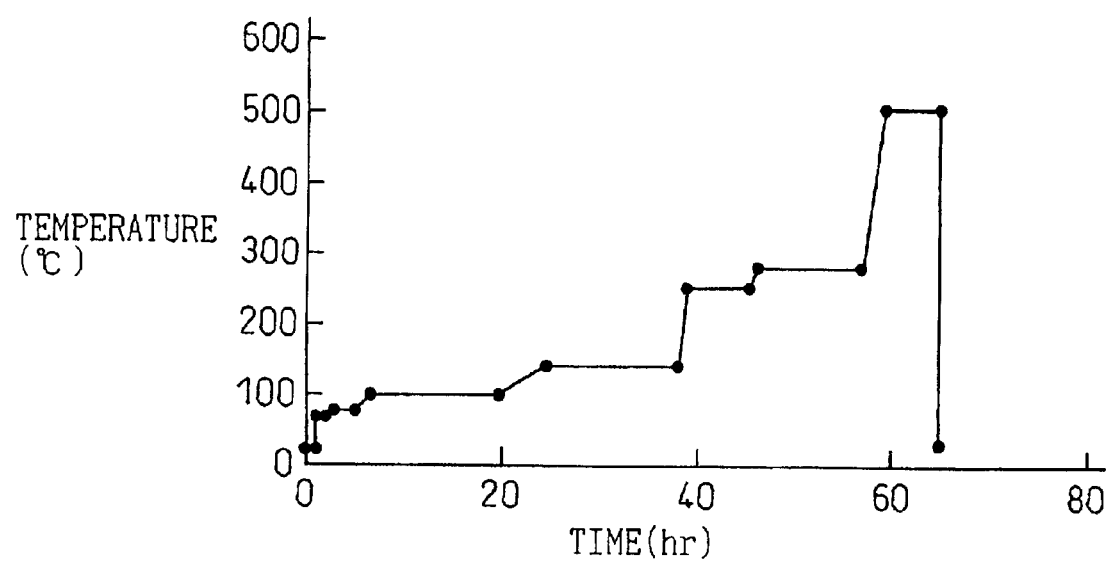

MgO sheets 81 (15 mm×15 mm×1 mm) having void ratio of 20% were placed on top and bottom of the laminated body 6 as shown in FIG. 7(a) and put into a sagger made of MgO. The stack was degreased in air atmosphere by controlling the temperature in the pattern shown in FIG. 7(b) (maximum temperature 500° C.).

Figure 8:
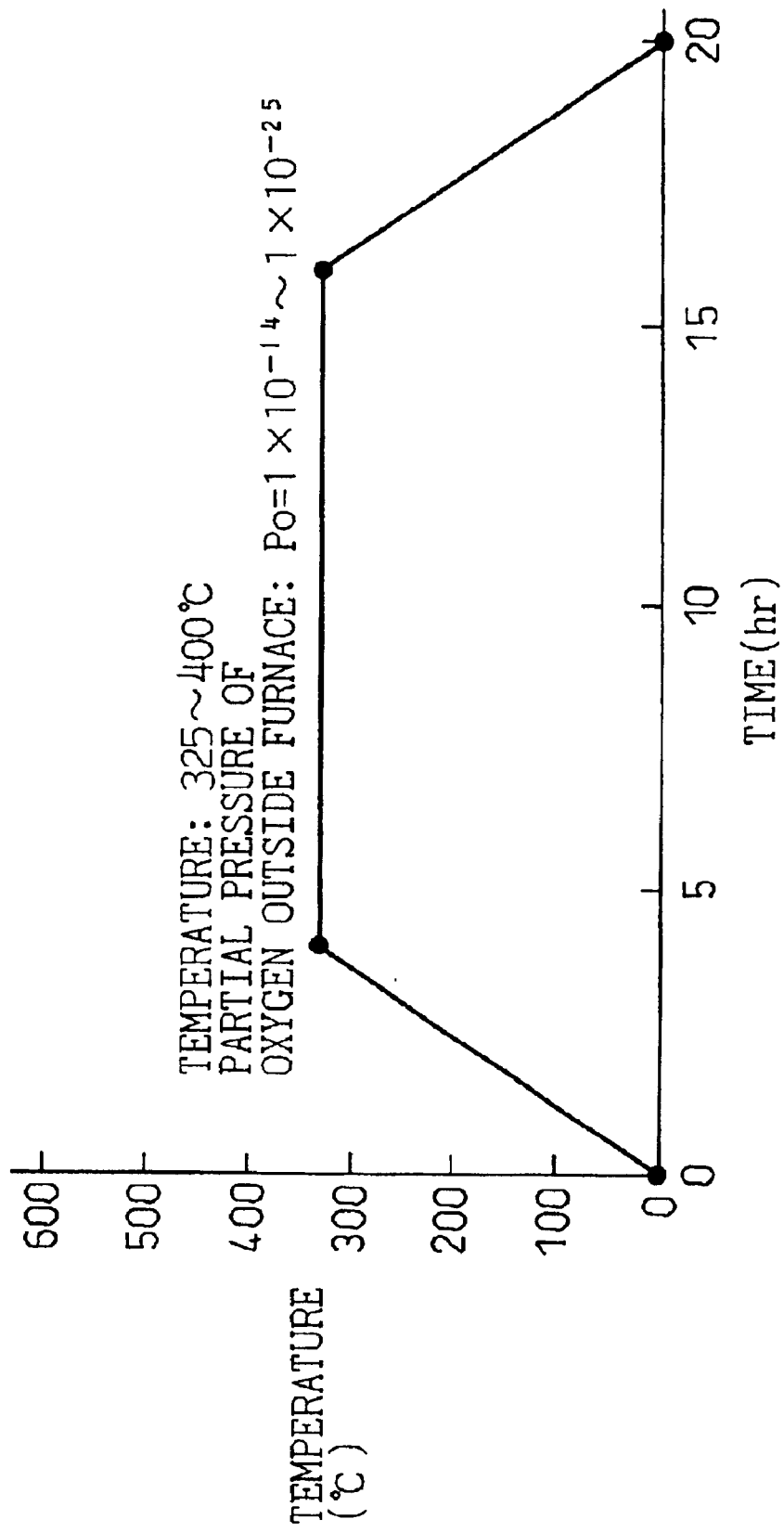
FIG. 8 shows a pattern of changing the reduction process temperature.

The degreased stack 6 was subjected to a reduction process with the temperature pattern shown in FIG. 8. The reduction was carried out in an atmosphere including 5000 ml/ml of $Ar-H_2$ (1%) and 8 to 6 ml/min of $O_2$ (pure) while controlling the partial pressure of oxygen to $1\times10^{-23.5}$ In terms of the partial pressure of oxygen outside the furnace. Processing temperature (maximum temperature) was set to about 350° C. and was maintained for 12 hours. Similarly to the degreasing process described above, MgO sheets 81 were placed on top and bottom of the laminated body 1 that was then put into a sagger and subjected to reduction process.

Concentrations of gases in the reducing atmosphere and the quantity processed may be other than those described above as long as the partial pressure of oxygen outside the furnace can be controlled in a range from $1\times10^{-14}$ to $1\times10^{-25}$ atm (at this time, actual ratio of $H_2$ to $O_2$ (supplied into the furnace is in a range from 50:50 to 50:5.5).

Figure 9A:
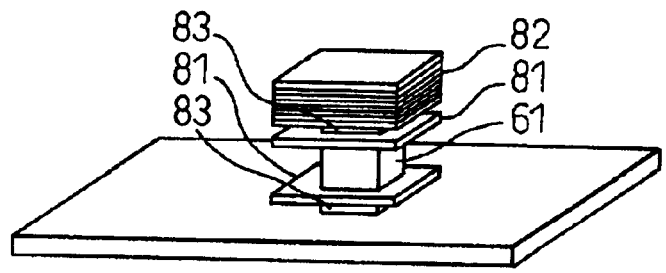
FIG. 9(a) is a perspective view showing the constitution of fixtures in the sintering process and FIG. 9(b) and FIG. 9(c) are an exploded perspective view and a side view of FIG. 9(a), respectively.
Figure 9B:
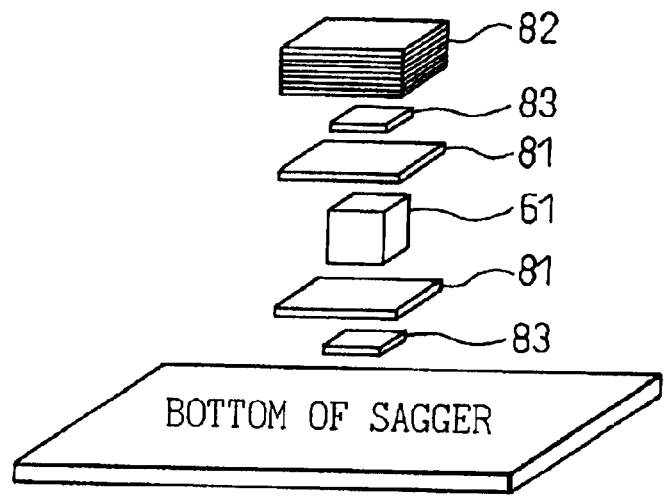

The reduced stack 6 was put into a sagger made of MgO and sintered in reducing atmosphere with the fixture constitution shown in FIGS. 9(a), (b).

Figure 9C:
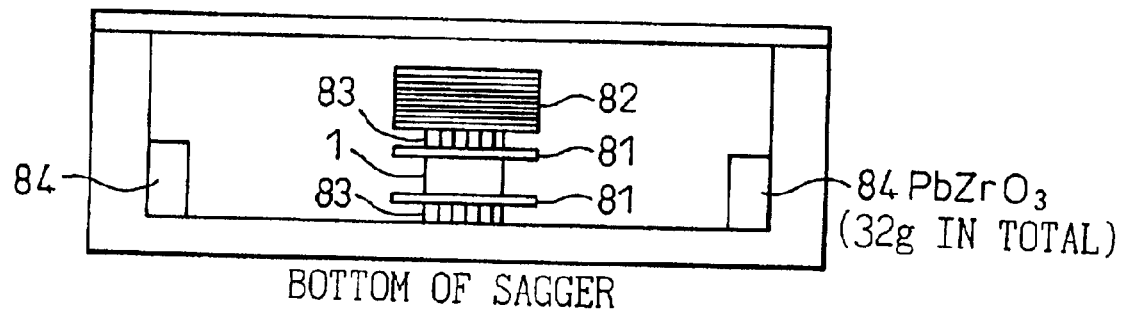

MgO sheets 81 (15 mm×15 mm×1 mm) and cordielite honeycombs 83 used as the spacer were placed on top and bottom of the laminated body 6, and a weight made of MgO 82 (1 to 10 g) was placed on the top. External shape of the MgO 82 was made substantially the same as the MgO sheets 81. In order to prevent the composition of the stack 6 from changing due to evaporation of PbO at high temperatures, lead zirconate ($PbZrO_3$) 84 (32 g in all) was placed on the bottom of the sagger and along the periphery thereof, as shown FIG. 9(c).

Figure 10:
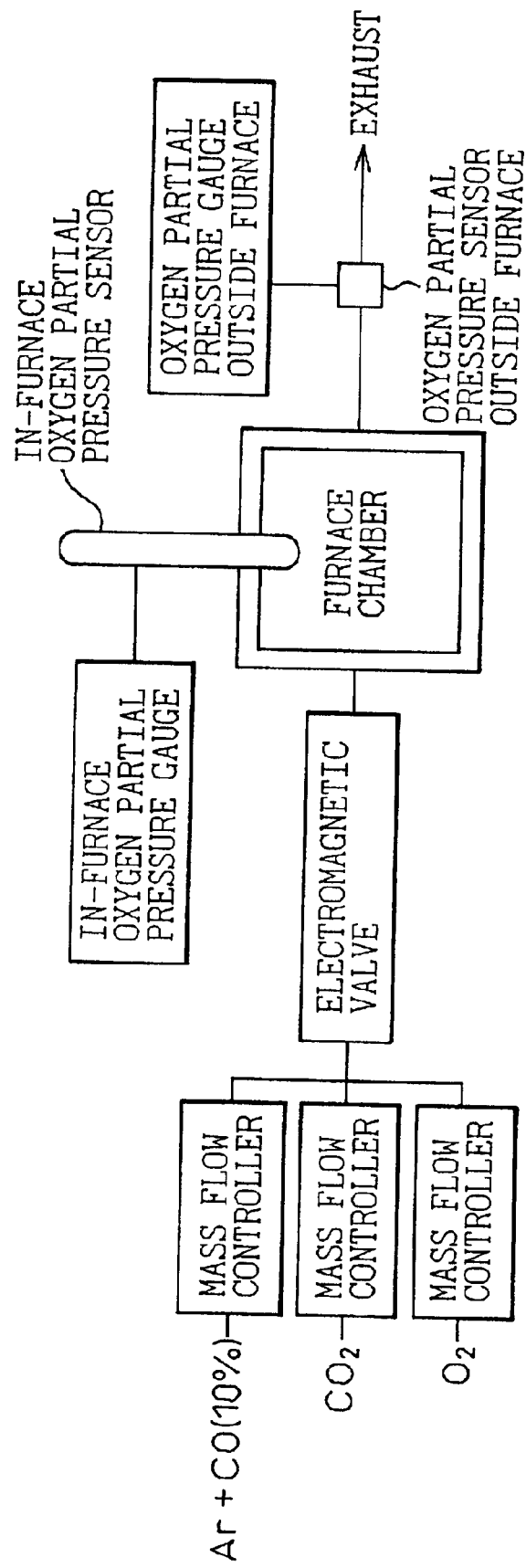
FIG. 10 shows the configuration and piping connection of a sintering furnace used in the sintering process.

The crucible containing the stack 6 described above was put into a furnace capable of sintering in a reducing atmosphere as shown in FIG. 10 and reducing sintering was carried out under the pattern of temperature and atmosphere shown in FIG. 11. The furnace is fitted with pipes for introducing $CO_2$ (pure), Ar—CO (10%) and $O_2$ (pure) into the furnace as shown in FIG. 10, while the flow rate of each gas can be controlled by means of a mass flow controller.

Temperature was raised according to the pattern shown in FIG. 11(a) and a sintering temperature of about 950° C. and a partial pressure of oxygen outside the furnace $1\times10^{-6}$ atm were maintained for about four hours, thereby to obtain a sintered dielectric material. A profile of the reducing sintering carried out as described above is shown in FIG. 11(b). A stable atmosphere within $10^y$ for a target value of x (y=x±0.3) was achieved with constant temperature and partial pressure of oxygen.

Figure 11C:
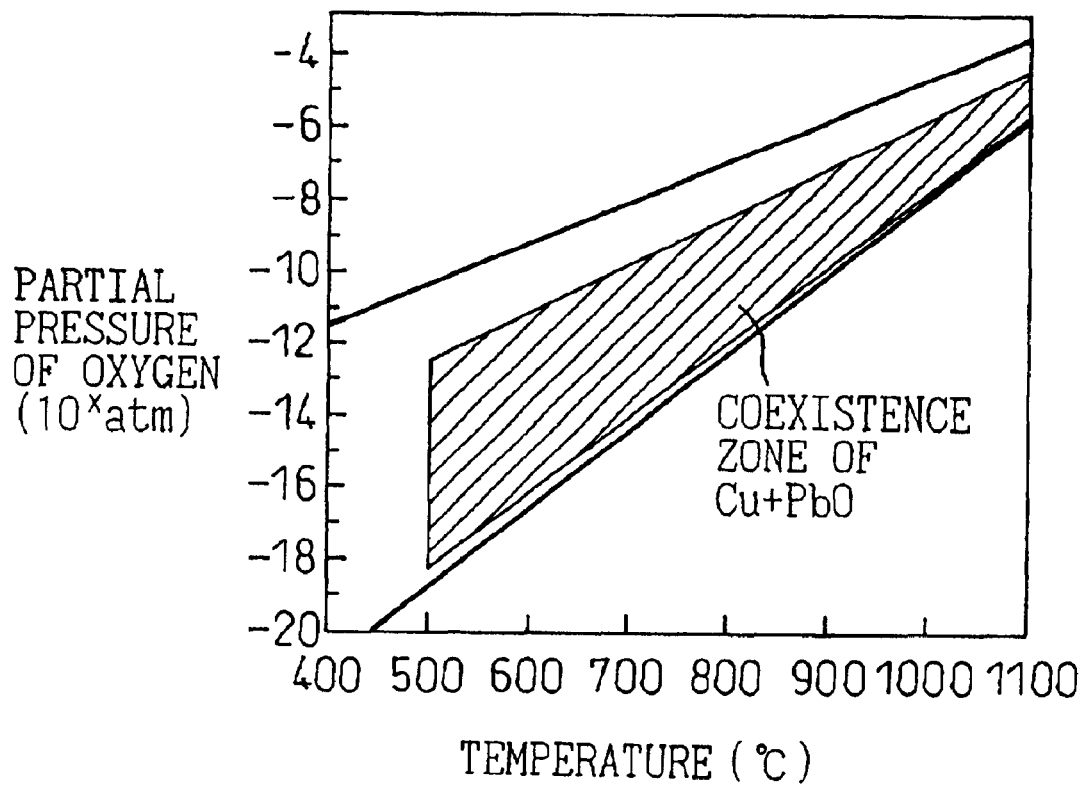

Temperature and atmosphere patterns are not limited to those shown in FIG. 11(a), and reducing sintering can be carried out within the ranges of temperature and partial pressure of oxygen shown in FIG. 11(c) at temperatures not lower than 500° C., while achieving similar effects by setting the range of partial pressure of oxygen in which PbO is not reduced and Cu is not oxidized in accordance to the sintering temperature as shown in the drawing. In this case, the supply of gasses into the furnace is preferably set to $CO_2:CO:O_2=5000:500$ to 0:20 to 0. The rate of raising the temperature is preferably set in a range from 300 to 20° C.

What is claimed is:

1. A method, for producing the low-temperature sintered dielectric ceramic material having a composition of $ABO_3$ dielectric ceramic material where a 0.9 molar ratio or more lead is included in site A assuming the proportion of site B is 1, and at least one of tungsten and molybdenum is included, wherein the density of the dielectric ceramic material, after sintering, is 7.5 g/cm³ or larger, and the combined content of tungsten and molybdenum is less than 0.098 mole to 1 mole of lead, which method comprises
(1) preparing an auxiliary oxide that is made by adding the oxide of at least one of tungsten and molybdenum to lead oxide in proportion of:

$PbOx+(WO_3y+MoO_{3z})$ where $x+y+z=1$, $0.005<y+z<0.4$ and $y, z \geqq 0$;
(2) adding 0.05 mol % to 6 mol % of said auxiliary oxide prepared in step (1) to a mixture of a stock material of low-temperature sintered dielectric ceramic material or calcination thereof that has a composition of $ABO_3$ dielectric ceramic material where 0.9 molar ratio or more lead is included in site A assuming the proportion of site B is 1;
(3) mixing the material, followed by
(4) forming and further sintering.

2. The method for producing the low-temperature sintered dielectric ceramic material according to claim 1, wherein said auxiliary oxide is made by adding the oxide of at least one of tungsten and molybdenum to lead oxide in a dry or a wet mixing process, then processing the mixture through calcination and crushing.

3. The method for producing the low-temperature sintered dielectric ceramic material according to claim 1, wherein the quantity of lead included in the stock material is set to the required quantity minus the quantity supplied from the lead oxide included in the auxiliary oxide, in preparing the stock material to make the dielectric ceramic material.

4. The method for producing the low-temperature sintered dielectric ceramic material according to claim 1, wherein said auxiliary oxide used has melting point in a range from a temperature at which shrinkage ratio of the dielectric ceramic material is 3% to a temperature at which the shrinkage stops.

5. The method for producing the low-temperature sintered dielectric ceramic material according to claim 2, wherein a sheet of said dielectric ceramic material made by adding the auxiliary oxide to the stock powder or calcined stock powder, printing an electrode layer laminated thereon and calcining the lamination at the same time as the sheet is calcined.

6. The method for producing the low-temperature sintered dielectric ceramic material according to claim 2, wherein the quantity of lead included in the stock material is set to the required quantity minus the quantity supplied from the lead oxide included in the auxiliary oxide, in preparing the stock material to make the dielectric ceramic material.

7. The method for producing the low-temperature sintered dielectric ceramic material according to claim 1, wherein the low-temperature sintered dielectric ceramic material includes lead zirconate titanate as a main component.

* * * * *